(12) United States Patent
Hanazawa et al.

(10) Patent No.: US 7,692,456 B2
(45) Date of Patent: Apr. 6, 2010

(54) SEMICONDUCTOR INTEGRATED CIRCUIT CAPABLE OF DIRECTLY COUPLING LOW-VOLTAGE SIGNALS WITH HIGH-VOLTAGE SIGNALS

(75) Inventors: Satoshi Hanazawa, Hamura (JP); Hiroyasu Yoshizawa, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/958,373

(22) Filed: Dec. 17, 2007

(65) Prior Publication Data
US 2008/0238532 A1    Oct. 2, 2008

(30) Foreign Application Priority Data
Mar. 30, 2007    (JP)    ............... 2007-090207

(51) Int. Cl.
*H03K 3/00*    (2006.01)
(52) U.S. Cl. ...................... 327/108; 327/112
(58) Field of Classification Search ................. 327/108, 327/109, 110, 111, 112
See application file for complete search history.

(56) References Cited

U.S. PATENT DOCUMENTS 5,382,917 A * 1/1995 Miyake et al. ............... 330/255
6,441,432 B1   8/2002 Sumida
7,400,163 B2 * 7/2008 Yanagigawa et al. .......... 326/26

FOREIGN PATENT DOCUMENTS

| JP | 6-53113 B2 | 7/1994 |
| JP | 11-205112 A | 7/1999 |
| JP | 2000-156495 A | 6/2000 |
| JP | 2005-340624 A | 12/2005 |

OTHER PUBLICATIONS

Supertex inc. Hv732 Data Sheet for High Speed ±100V 2A Integrated Ultrasound Pulser.

* cited by examiner

*Primary Examiner*—Kenneth B. Wells
(74) *Attorney, Agent, or Firm*—Miles & Stockbridge P.C.

(57) ABSTRACT

A semiconductor integrated circuit having a plurality of ultrasound pulsers corresponding to a plurality of respective channels, and integrally formed on a small area. The ultrasound pulsers each include a MOSFET gate drive circuit in which an input voltage pulse is converted into a current pulse, and the current pulse is converted again into a voltage pulse on the basis of a high potential side voltage +HV, and a low potential side voltage −HV, applied to a transducer drive circuit, and in which a voltage level shift in the input voltage pulse is attained, and a voltage pulse swing is generated by the MOSFET gate drive circuit on the basis of the high potential side voltage +HV, and the low potential side voltage −HV. The MOSFET gate drive circuit is DC-coupled with the transducer drive circuit.

13 Claims, 4 Drawing Sheets

PRIOR ART

FIG. 4

PRIOR ART

SEMICONDUCTOR INTEGRATED CIRCUIT CAPABLE OF DIRECTLY COUPLING LOW-VOLTAGE SIGNALS WITH HIGH-VOLTAGE SIGNALS

CLAIM OF PRIORITY

The present application claims priority from Japanese application JP 2007-090207 filed on Mar. 30, 2007, the content of which is hereby incorporated by reference into this application.

FIELD OF THE INVENTION

The present invention relates to a semiconductor integrated circuit device having a high voltage high-speed power switching circuit, and a high-voltage resistant high power driver circuit, and in particular, to a semiconductor integrated circuit device with high-voltage resistant elements and low-voltage resistant elements making up an ultrasound pulser for a medical ultrasound system, integrated on one and the same substrate such as a monocrystalline silicon.

BACKGROUND OF THE INVENTION

There has been available a conventional pulser for a medical ultrasound system having a drive circuit for converting a predetermined input pulse into a high-voltage pulse to be thereby sent out, and an output transistor to be driven for switching by the high-voltage pulse, for sending out an output pulse for oscillation to an ultrasonic transducer (refer to, for example, JP-B No. 06 (1994)-53113). Besides, there has been available a driver (refer to, for example, JP-A No. 2005-340624 and JP-A No. 2000-156495) for driving a plasma display panel, or a pulser similarly having a driver circuit disposed in a front stage, and an output transistor connected to a succeeding stage thereof, in a driver (refer to, for example, JP-A No. 11 (1999)-205112) for driving a high-voltage resistant power integrated circuit for household appliance use, automobiles use, industrial use, and so forth.

Further, there has been available a conventional pulser for a medical ultrasound system (refer to, for example, Supertex Inc., HV732 data sheet) comprising a gate drive circuit made up of voltage level translators, and voltage buffers, for receiving logical pulses to thereby drive a gate unit in a succeeding stage, and a transducer drive circuit made up of an output transistor and the gate unit including a clamping circuit, for driving an ultrasonic transducer in a succeeding stage, wherein the gate drive circuit is coupled to the transducer drive circuit via capacitors.

SUMMARY OF THE INVENTION

Figure 4:
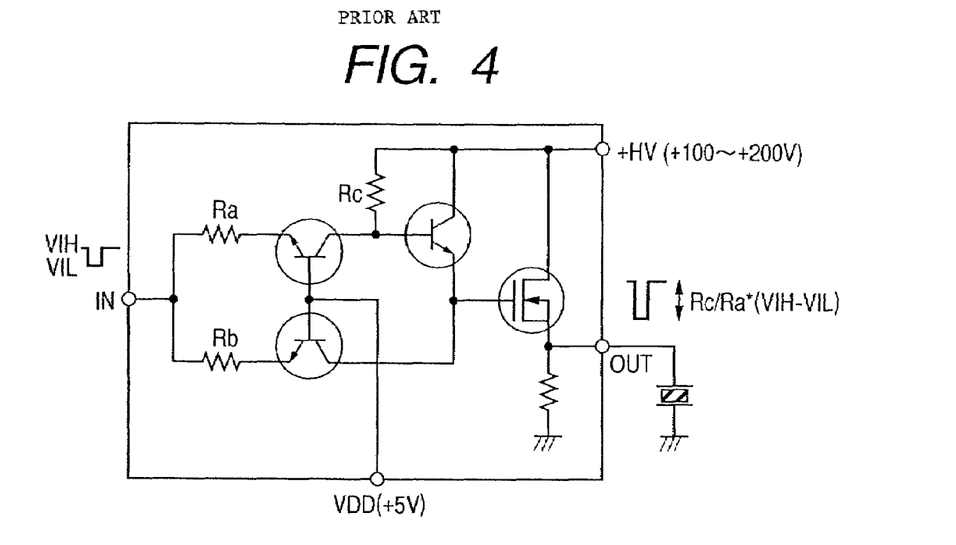
FIG. 4 is a block diagram of a driver, obtained by reconsidering FIG. 1 disclosed in JP-B No. 06 (1994)-53113 from an inventor's own point of view prior to the present invention.
Figure 5:
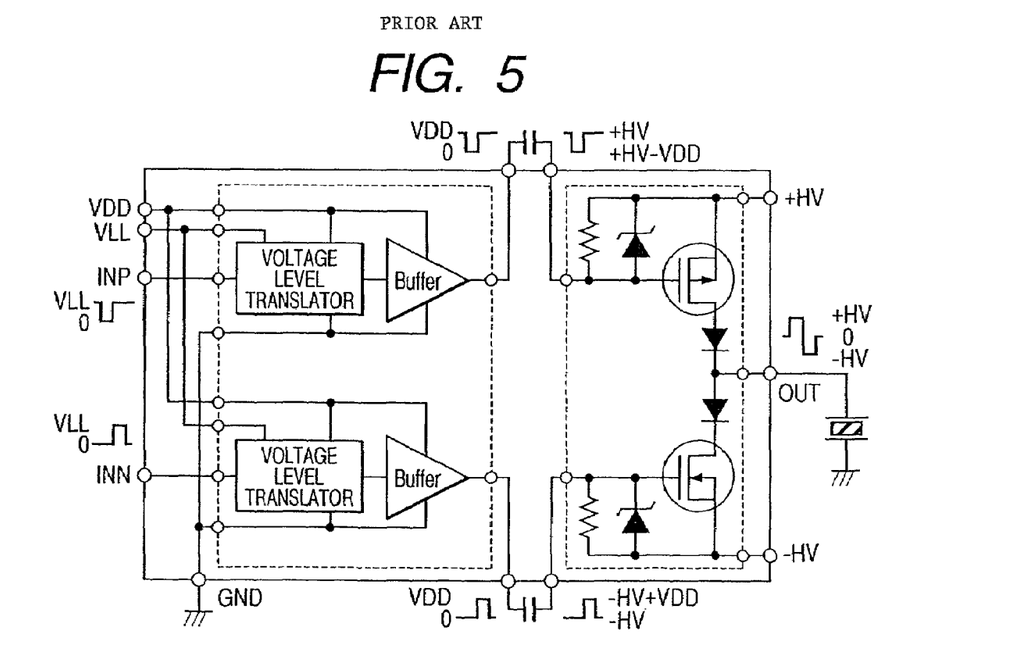
FIG. 5 is a block diagram of a driver, obtained by reconsidering the representative drawing described in Supertex Inc., HV732 data sheet from the inventor's own point of view prior to the present invention.

With transmitter/receiver (Tx/Rx) for use in the medical ultrasound system, further integration for the purposes of achieving enhancement in image resolution by adoption of further multi-channels, and acquisition of three-dimensional images have been continuously promoted. FIG. 4 is a block diagram of a driver, obtained by reconsidering FIG. 1 disclosed in JP-B No. 06 (1994)-53113 from an inventor's own point of view prior to the present invention. Further, FIG. 5 is a block diagram of a driver, obtained by reconsidering the representative drawing described in Supertex Inc., HV732 data sheet from the inventor's own point of view prior to the present invention. With those drivers, there has been the demand for multi-channel integration by taking a circuit configuration shown in FIG. 4 or FIG. 5, as a unit channel, however, such integration is difficult to implement because high-voltage operating parts and low-voltage operating parts are mixedly present in the circuit configuration, and it has therefore become a challenge to implement high-density mounting through the multi-channel integration by solving this problem. Further, an output pulse swing of a driver needs to be variable in a range of 0 V on the order of ±200 V because a necessary output pulse swing varies depending on a difference between ultrasonic transducer types with respect to voltage–sound-pressure conversion efficiency, a diagnosis block, a diagnostic method, and so forth, and a channel as a damper is normally operated at 0 V.

In JP-B No. 06 (1994)-53113, there is described the pulser for the medical ultrasound system wherein a gate drive circuit for receiving logical pulses to thereby drive a gate unit in a succeeding stage is DC-coupled to a transducer drive circuit for driving an ultrasonic transducer. As shown in FIG. 4, there is described an example of a driver capable of achieving an output pulse with a fixed swing of Rc/Ra*(VIH−VIL), proportional to an input pulse swing, by use of high-voltage resistant npn bipolar transistors, and a high-voltage resistant n-channel MOSFET (MOS field effect transistor). In the drawings shown hereinafter, a transistor surrounded by a circle indicates a high-voltage resistant transistor while a transistor not in a circle indicates a low-voltage resistant transistor.

The circuit shown in JP-B No. 06 (1994)-53113 is the driver wherein the gate drive circuit is DC-coupled to the transducer drive circuit. With this configuration, an external capacitor is not required, and there is no need for an output terminal of the gate drive circuit, and an input terminal of the transducer drive circuit, required for connection with the external capacitor, so that it is a configuration wherein the multi-channel integration can be readily implemented, however, with this circuit style, it is necessary that all the transistors should be high-voltage resistant transistors. In general, a layout area of the high-voltage resistant transistor, on a semiconductor substrate, is fairly larger than that of the low-voltage resistant transistor, which poses a barrier against promotion of the multi-channel integration. Further, since an output pulse swing becomes Rc/Ra*(VIH−VIL) proportional to the input pulse swing, it is necessary to render the input pulse swing variable to render the output pulse swing variable. That is, a variable width of the output pulse swing is dependent on a variable width of the input pulse swing, and, for example, in the case where it has been decided that Rc/Ra can output the output pulse swing at not lower than 100 V, a problem has been encountered in that it is, in theory, difficult to produce a pulse with a small swing on the order of several V. In this respect, the same applies to respective driver configurations described in Patent Documents 2 to 4.

Meanwhile, in Supertex Inc., HV732 data sheet, there is described the pulser for the medical ultrasound system wherein the gate drive circuit for receiving the logical pulses to thereby drive the gate unit in the succeeding stage is AC-coupled to the transducer drive circuit for driving the transducer. As shown in FIG. 5, there is described an example of a driver wherein low-voltage resistant CMOSFETs (Complementary MOSFETs) are used in the gate drive circuit while high-voltage resistant CMOSFETs are used in the transducer drive circuit, the gate drive circuit drives the transducer drive circuit via external capacitors, and a variable output pulse swing is implemented by varying voltages +HV, and −HV, applied to the transducer drive circuit.

The circuit shown in Supertex Inc., HV732 data sheet is the driver wherein the gate drive circuit is AC-coupled to the transducer drive circuit via the external capacitors. With this circuit style, it becomes possible to render the output pulse swing variable in the range of 0 V on the order of ±200 V. However, since two terminals are required for connection with one external capacitor, a problem has been encountered in that channel integration is limited due to an increase in the number of total terminals of a package, and constraints imposed on mounting of the external capacitors.

It is therefore an object of the invention to provide an ultrasound pulser wherein outputs of a MOSFET gate drive circuit are DC-coupled with inputs of a transducer drive circuit, respectively, and output pulses, on both high potential and low potential sides, are rendered variable in a range of 0 V on the order of ±200 V by use of low-voltage resistant transistors advantageous in terms of a layout area of a semiconductor substrate wherever possible.

An example of a representative configuration of the invention is described as follows. That is, the invention provides in its one aspect a semiconductor integrated circuit comprising input terminals, a first drive circuit connected to the terminals, for converting a first voltage pulse signal having a first reference potential, inputted from the respective terminals, into a second voltage pulse signal having a second reference potential higher than the first reference potential to be thereby outputted, a second drive circuit connected to outputs of the first drive circuit, for generating a fourth voltage pulse signal with a voltage swing based on a potential difference between the second reference potential, and a ground potential, for driving an external output load on the basis of the second voltage pulse signal inputted from the respective outputs of the first drive circuit to be thereby outputted, and an output OUT connected to outputs of the second drive circuit, for outputting the fourth voltage pulse signal outputted by the second drive circuit to the external output load, wherein the first drive circuit is integrated with the second drive circuit into one unit on a single semiconductor substrate, the outputs of the first drive circuit are mutually DC-coupled with inputs of the second drive circuit, respectively, and the first drive circuit includes voltage-to-current converters for converting a third voltage pulse signal based on the first voltage pulse signal into a current pulse signal, respectively, and current-to-voltage converters for converting the current pulse signals inputted from respective outputs of the voltage-to-current converters into the second voltage pulse signal, respectively, such that reference potentials of the respective current pulse signals are changed from the first reference potential to the second reference potential.

With the invention, an ultrasound pulser having an output pulse swing variable range of 0 V on the order of ±200 V, suitable for application to a medical ultrasound system, can be implemented on a semiconductor substrate small in area, leading to implementation of the ultrasound pulsers in the form of a semiconductor integrated circuit wherein a plurality of channels are integrated.

DETAILED DESCRIPTION OF THE PREFERRED EMBODIMENTS

Preferred embodiments of the invention are described hereinafter with reference to the accompanying drawings. Circuit elements making up respective blocks of an embodiment include a low-voltage resistant CMOSFET, high-voltage resistant CMOSFET, diode, resistor, and capacitor, well known, and those circuit elements are formed on a single semiconductor substrate such as a monocrystalline silicon by an IC technology.

First Embodiment

Figure 1:
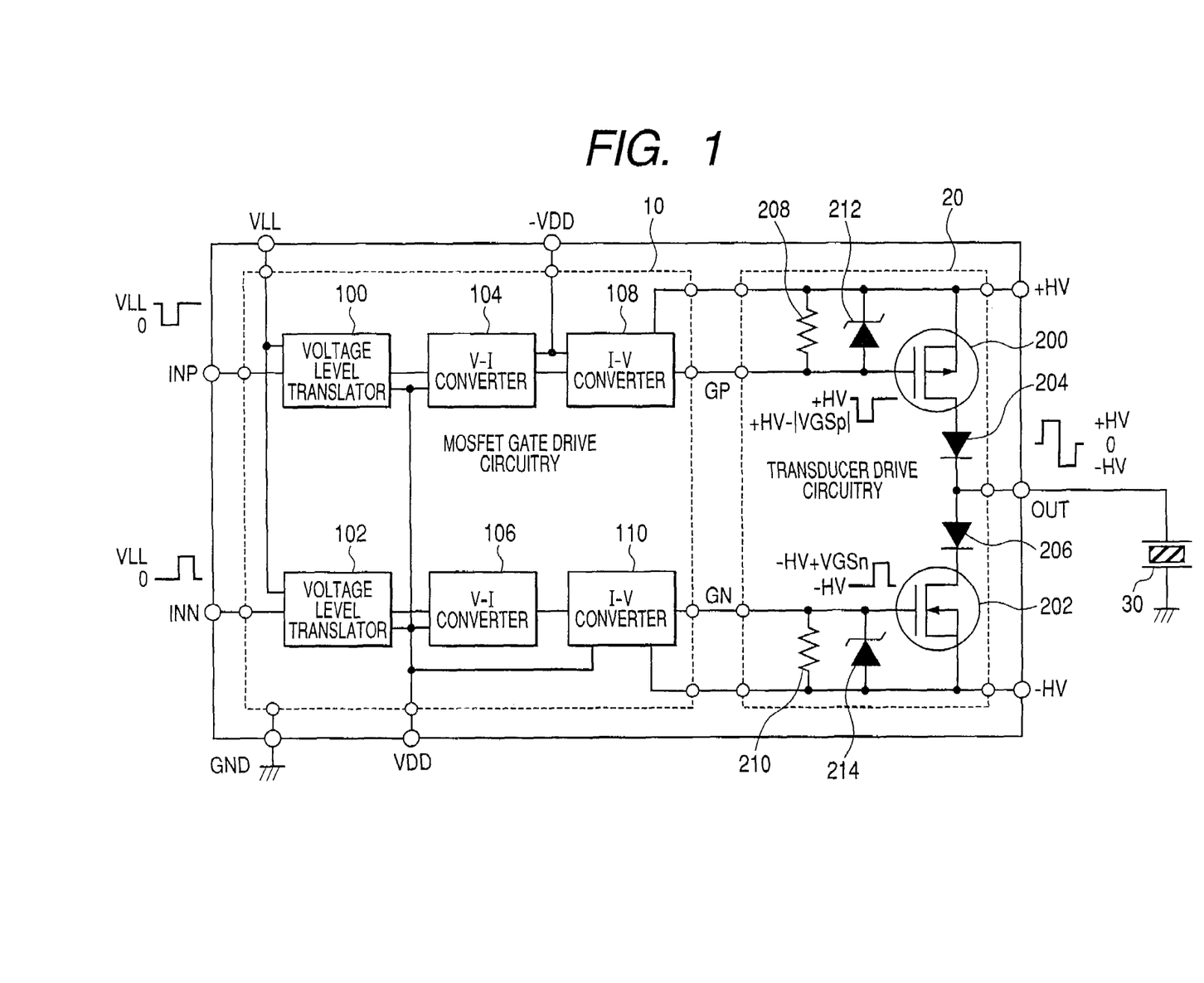
FIG. 1 is a block diagram showing one embodiment of an ultrasound pulser to which the invention is applied.

FIG. 1 is a block diagram showing a first embodiment of an ultrasound pulser to which the invention is applied. The driver according to the present embodiment is implemented as a semiconductor integrated circuit having the following features. More specifically, the semiconductor integrated circuit according to the present embodiment comprises input terminals INP, INN, a first drive circuit 10 connected to the respective terminals INP, INN, for converting a pair of first voltage pulse signals each having a first reference potential and input from the respective terminals INP, INN into a pair of second voltage pulse signals each having a second reference potential higher than the first reference potential, a second drive circuit 20 connected to outputs of the first drive circuit 10, for generating a fourth voltage pulse signal for driving an external output load 30 on the basis of the second voltage pulse signal input from the respective outputs of the first drive circuit 10, and an output OUT connected to outputs of the second drive circuit 20, for outputting the fourth voltage pulse signal outputted by the second drive circuit 20 to the external output load 30. The first drive circuit 10 is integrated with the second drive circuit 20 into one unit on a single semiconductor substrate, and the outputs of the first drive circuit 10 are mutually DC-coupled with inputs of the second drive circuit 20, respectively. The first drive circuit 10 includes voltage-to-current converters 104, 106, for converting a voltage pulse signal based on the first voltage pulse signal into a current pulse signal, respectively, and current-to-voltage converters 108, 110, for converting the current pulse signals input from respective outputs of the voltage-to-current converters 104, 106 into a second voltage pulse signal, respectively.

The second drive circuit 20 is normally higher in voltage resistance than the first drive circuit 10. Further, the first drive circuit 10 preferably further comprises voltage level translators 100, 102, interconnecting the respective terminals INP, INN, and respective inputs of the voltage-to-current converters 104, 106, respectively. In this case, the first voltage pulse signal having the first reference potential is converted into a third voltage pulse signal having the second reference potential through the respective voltage level translators 100, 102.

The semiconductor integrated circuit according to the present embodiment preferably further comprises third power supply voltage terminals +VDD, −VDD, made up such that a third power supply voltage is applied thereto, and second power supply voltage terminals +HV, −HV, made up such that a second power supply voltage higher than the third power supply voltage is applied thereto. In this case, the first drive circuit 10 is connected to a first power supply voltage terminal VLL, the second power supply voltage terminals +HV, −HV, and the third power supply voltage terminals +VDD, −VDD, respectively, and the second drive circuit 20 is connected to the second power supply voltage terminals +HV, −HV, respectively. The second drive circuit 20 generates the fourth voltage pulse signal from the second voltage pulse signal on the basis of the second power supply voltage applied to the second drive circuit 20 via the second power supply voltage terminals +HV, −HV, respectively. Further, the first drive circuit 10 preferably comprises an internal power supply circuit including a source follower, for generating an input gate voltage swing of the second drive circuit 20 on the basis of the second power supply voltage applied to the second drive circuit 20.

When the semiconductor integrated circuit according to the present embodiment is applied to an ultrasound pulser for a medical ultrasound system, the external output load 30 is an ultrasonic transducer, the second drive circuit 20 is a transducer drive circuit, and the first drive circuit 10 is a MOSFET gate drive circuit for driving input gates 200, 202, making up the second drive circuit 20. Accordingly, it follows that the ultrasound pulser for the medical ultrasound system is comprised of the MOSFET gate drive circuit 10, and the transducer drive circuit 20.

It can be taken that the semiconductor integrated circuit according to the present embodiment comprises a first drive circuit 10 having a first high voltage resistance, and a second drive circuit 20 connected to a back stage of the first drive circuit 10, having a second high voltage resistance higher than the first high voltage resistance. In this case, the first drive circuit 10 comprises voltage-to-current converters 104, 106, for converting an input voltage signal into a current signal, respectively, and current-to-voltage converters 108, 110, for converting the current signal into a voltage signal, respectively. An element having the second high voltage resistance is used at respective spots of the converters 104, 106, 108, 110, where the second high voltage resistance is required. In this case, a voltage signal with a voltage pulse swing based on an output voltage keeping a fixed difference from a voltage necessary for driving the second drive circuit 20 is preferably outputted to the second drive circuit 20.

The first drive circuit 10 is preferably made up so as to be operated by first, second, and third operating voltages, respectively, having a circuit for generating a second potential having a predetermined potential difference on the basis of a predetermined third potential. In this case, the second drive circuit 20 is operated at the second potential as the operating voltage, and signal transmission from the first drive circuit 10 to the second drive circuit 20 is executed by the respective voltage-to-current converters 104, 106, for converting the input voltage signal into the current signal, and the respective current-to-voltage converters 108, 110, for converting the current signal into a voltage signal.

With the present embodiment, the ultrasonic transducer 30 connected to the output terminal OUT may be driven by a bipolar voltage output pulse having positive and negative components, as shown in, for example, FIG. 1 (+HV to −HV).

The present ultrasound pulser is comprised of the MOSFET gate drive circuit 10, and the transducer drive circuit 20. The MOSFET gate drive circuit 10 preferably comprises the voltage level translators 100, 102, connected to, for example, an input logic control terminal INP of the high voltage Pch MOSFET and an input logic control terminal INN of the high voltage Nch MOSFET, respectively, the voltage-to-current converters 104, 106, and the current-to-voltage converters 108, 110. The transducer drive circuit 20 preferably comprises for example, a high voltage resistant p-channel MOSFET 200, and a high voltage resistant n-channel MOSFET 202, connected to outputs GP, GN of the MOSFET gate drive circuit 10, respectively, Zener diodes 212, 214, for protection of respective gates of the MOSFETs 200, 202, resistors 208, 210, and high voltage resistant diodes 204, 206.

Figure 2:
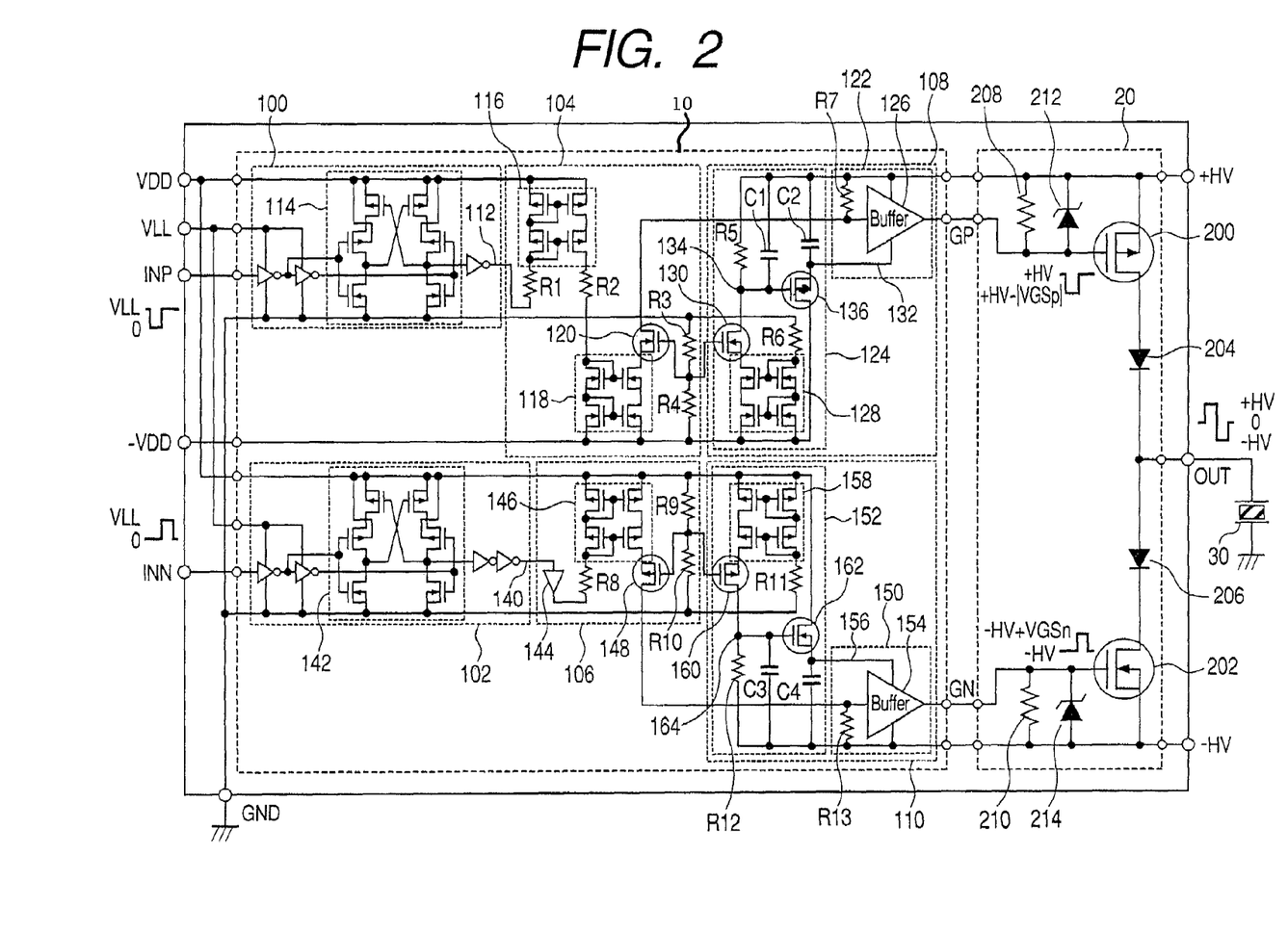
FIG. 2 is a view showing a specific configuration example of the ultrasound pulser to which the invention is applied.

FIG. 2 shows a specific configuration example of the ultrasound pulser shown in FIG. 1. In FIG. 2, reference numerals 10, 20, 30, 100, 102, 104, 106, 108, 110, 200, 202, 204, 206, 208, 210, 212, and 214 each indicate a circuit block, and a circuit element, corresponding to each of the same reference numerals in FIG. 1. First, there is described hereunder a signal path from the input logic control terminal INP of the high voltage Pch MOSFET to the high voltage resistant p-channel MOSFET 200.

The voltage level translator 100 converts a voltage pulse swing of VLL, inputted to INP, into VDD, equal to an operating power supply voltage of the voltage-to-current converter 104 in the next stage. That is, a high level input voltage Vih=VLL, and a low level input voltage Vil=0 V, at INP, are converted into a high level output voltage Voh=VDD, a low level output voltage Vol=0 V, respectively, at an output 112 of the voltage level translator 100. Such conversion is implemented by a latch circuit 114. The voltage-to-current converter 104 converts the output voltage pulse signal of the voltage level translator 100 in a preceding stage into the current pulse signal. The voltage-to-current converter 104 is comprised of resistors R1, R2, R3, current mirror circuits 116, 118, and a high voltage resistant n-channel MOSFET 120. When the output 112 of the voltage level translator 100 is at a high level, the current mirror circuit 116 has a reference voltage at VDD, so that no potential difference occurs to the resistor R1, and no current flows to a mirror source of the current mirror circuit 116. On the other hand, when the output 112 is at a low level, a potential difference of VDD−2*Vgs occurs across both ends of the resistor R1, resulting in flow of current expressed by (VDD−2*Vgs)/R1. This Vgs represents a gate–source voltage of a low voltage resistant p-channel MOSFET as a constituent of the current mirror circuit 116. That is, a voltage pulse at the output 112 is converted into a current pulse by the resistor R1. The current pulse is returned to the current mirror circuit 118 having a source-side reference voltage at −VDD by the current mirror circuit 116, and current mirroring is executed. A high voltage resistant n-channel MOSFET 120 is inserted to prevent a high voltage not lower than a absolute rating from being applied between the source and the drain of a low voltage resistant n-channel MOSFET as a mirrored destination of the current mirror circuit 118, and the resistors R3, R4 are set such that a gate potential expressed by (R4/(R3+R4)−1)*VDD can cause the high voltage resistant n-channel MOSFET 120 to adequately operate.

With the present configuration example, the current mirror circuits 116, 118 each are shown in cascade configuration to improve accuracy in current mirroring by the current mirror circuits 116, 118, respectively. The same applies to current mirror circuits 128, 146, 158, to be described hereinafter.

The current-to-voltage converter 108 converts the current pulse signal output by the voltage-to-current converter 104 in a preceding stage into the voltage pulse signal having a voltage pulse swing |VGSp|, and a high level output voltage Voh=+HV, equal to a voltage +HV applied to a source terminal of the high voltage resistant p-channel MOSFET 200 of the transducer drive circuit 20 in the next stage. Herein, |VGSp| refers to a voltage applied between the source and the gate of the high voltage resistant p-channel MOSFET 200, optimal to operate the same. The current-to-voltage converter 108 comprises a block 122 where current-to-voltage conversion, and buffering are executed, and a block 124 where the swing |VGSp| for driving the gate of the high voltage resistant p-channel MOSFET 200 of the transducer drive circuit 20 is generated with +HV as a reference potential. The current pulse generated by the voltage-to-current converter 104, described as above, is again converted into a voltage pulse by a resistor R7 of the block 122. If a mirror ratio of either of the current mirror circuits 116, 118 is 1:1, a swing of the voltage pulse converted by the resistor R7 is expressed by (VDD−2*Vgs)*R7/R1. This voltage pulse is input to a buffer 126 of the block 122, and the swing of this voltage pulse is normally set to the same as |VGSp|. Since a swing of an output voltage GP of the buffer 126 is the swing for driving the gate of the high voltage resistant p-channel MOSFET 200, as described above, the swing of the output voltage GP needs to be |VGSp|, and a low level output voltage +HV−|VGSp|, determined at a node 132 of the buffer 126, is generated in the block 124. The block 124 comprises a current mirror circuit 128, resistors R5, R6, capacitors C1, C2, a high voltage resistant n-channel MOSFET 130, and a high voltage resistant p-channel MOSFET 136. Current flowing to a mirror source of the current mirror circuit 128 is expressed by (VDD−2*Vgs)/R6. This Vgs represents a gate-source voltage of a low voltage resistant n-channel MOSFET as a constituent of the current mirror circuit 128. If a mirror ratio of the current mirror circuit 128 is 1:1, a potential at a node 134, converted by the resistor R5, is expressed by +HV−(VDD−2*Vgs)*R5/R6. The potential at the node 134 is determined such that a potential at the node 132 turns to +HV−|VGSp|, as described above. More specifically, R5, and R6 are determined so as to satisfy (VDD−2*Vgs)*R5/R6=|VGSp|+|Vgs136|. This |Vgs136| refers to a gate-source voltage of the high voltage resistant p-channel MOSFET 136 to execute operation as a source follower. The high voltage resistant n-channel MOSFET 130 is inserted to prevent a high voltage not lower than a absolute rating from being applied between the source and the drain of a low voltage resistant n-channel MOSFET as a mirrored destination of the current mirror circuit 128, and the resistors R3, R4 are set such that a gate potential expressed by (R4/(R3+R4)−1)*VDD can cause the high voltage resistant n-channel MOSFET 130 to adequately operate, as is the case with the high voltage resistant n-channel MOSFET 120. The capacitor C1 is inserted for the purpose of stabilization of a gate potential of the high voltage resistant p-channel MOSFET 136. The capacitor C2 is inserted between the node 132 as an output of the source follower, and +HV, functioning as a bypass capacitor for supplying instantaneous carrying current consumed by the buffer 126 with an output drive capacity thereof, enhanced to drive the gate of the high voltage resistant p-channel MOSFET 200.

With the current mirror circuits 116, 118, −VDD is a source side reference voltage, so that the signal path from the input logic control terminal INP of the high voltage Pch to the high voltage resistant p-channel MOSFET 200 can be operated as a channel as a damper of +HV=0 V, and +HV is optionally variable in the range of 0 V on the order of ±200 V.

Now, there is described hereunder a signal path from the input logic control terminal INN of the high voltage Nch MOSFET to the high voltage resistant n-channel MOSFET 202. The principle behind this signal path is basically the same as that behind the signal path from the input logic control terminal INP of the high voltage Pch MOSFET to the resistant p-channel MOSFET 200.

In FIG. 2, the voltage level translator 102 converts the voltage pulse swing of VLL, input to INN, into VDD, equal to an operating power supply voltage of the voltage-to-current converter 106 in the next stage. That is, the high level input voltage Vih=VLL, and the low level input voltage Vil=0 V, at INN, are converted into the low level output voltage Vol=0 V, and the high level output voltage Voh=VDD, respectively, at an output 140 of the voltage level translator 102. Such conversion is implemented by a latch circuit 142.

The voltage-to-current converter 106 converts an output voltage pulse signal of the voltage level translator 102 in a preceding stage into a current pulse signal. The voltage-to-current converter 106 is comprised of a buffer 144, resistors R8, R9, R10, a current mirror circuit 146, and a high voltage resistant p-channel MOSFET 148. When an output 140 of the voltage level translator 102 is at a high level, the current mirror circuit 146 has a reference voltage at VDD, so that no potential difference occurs to the resistor R8, and no current flows to a mirror source of the current mirror circuit 146. On the other hand, when the output 140 is at a low level, the potential difference of VDD−2*Vgs occurs across both ends of the resistor R8, resulting in flow of current expressed by (VDD−2*Vgs)/R8. This Vgs represents a gate-source voltage of a low voltage resistant p-channel MOSFET as a constituent of the current mirror circuit 146. That is, a voltage pulse at the output 140 is converted into a current pulse by the resistor R8. The high voltage resistant p-channel MOSFET 148 is inserted to prevent a high voltage not lower than a absolute rating from being applied between the source and the drain of a low voltage resistant p-channel MOSFET as a mirrored destination of the current mirror circuit 146, and the resistors R9, R10 are set such that a gate potential expressed by R10/(R9+R10)*VDD can cause the high voltage resistant p-channel MOSFET 148 to adequately operate. With the voltage-to-current converter 106, there is no need for current return corresponding to that for the current mirror circuit 118 of the voltage-to-current converter 104 for control of the voltage output pulse in the form protruding upward. Accordingly, the buffer 144 for compensating for propagation delay occurring due to the current return, serving as a delay buffer, is inserted in the signal path, thereby compensating for a difference in propagation delay time between the present signal path, and the signal path for the voltage output pulse in the form protruding upward.

The current-to-voltage converter 110 converts the current pulse signal outputted by the voltage-to-current converter 106 in a preceding stage into a voltage pulse signal having a voltage pulse swing VGSn, and a low level output voltage Vol=−HV equal to a voltage −HV applied to a source terminal of the high voltage resistant n-channel MOSFET 202 of the transducer drive circuit 20 in the next stage. Herein, VGSn refers to a voltage applied between the source and the gate of the high voltage resistant p-channel MOSFET 202, and is optimal to operate the same. The current-to-voltage converter 110 comprises a block 150 where current-to-voltage conversion and buffering are executed, and a block 152 where the swing VGSn for driving the gate of the high voltage resistant n-channel MOSFET 202 of the transducer drive circuit 20 is generated with −HV as a reference potential. The current pulse signal generated by the voltage-to-current converter 106, described above, is again converted into a voltage pulse signal by a resistor R13 of the block 150. If a mirror ratio of the current mirror circuit 146 is 1:1, a swing of the voltage pulse converted by the resistor R13 is expressed by (VDD−2*Vgs)*R13/R8. This voltage pulse is an input voltage to a buffer 154 of the block 150, and a swing of the voltage pulse is normally set to the same as VGSn. Since a swing of an output voltage GP of the buffer 154 is the swing for driving the gate of the high voltage resistant n-channel MOSFET 202, as described above, the swing of the output voltage GP needs to be VGSn, and a high level output voltage −HV+VGSn determined at a node 156 of the buffer 154, is generated in the block 152. The block 152 comprises a current mirror circuit 158, resistors R11, R12, capacitors C3, C4, a high voltage resistant p-channel MOSFET 160, and a high voltage resistant n-channel MOSFET 162. Current flowing to a mirror source of the current mirror circuit 158 is expressed by (VDD−2*Vgs)/R11. This Vgs refers to a gate–source voltage of a low voltage resistant p-channel MOSFET as a constituent of the current mirror circuit 158. If a mirror ratio of the current mirror circuit 158 is 1:1, a potential at a node 164, converted by the resistor R12, is expressed by −HV+(VDD−2*Vgs)*R12/R11. The potential at the node 164 is determined such that a potential at the node 156 turns to −HV+VGSn, as described above. More specifically, R11, and R12 are selected so as to satisfy (VDD−2*Vgs)*R12/R11=VGSn+Vgs162. This Vgs162 refers to a gate–source voltage of the high voltage resistant n-channel MOSFET 162 to execute operation as a source follower. The high voltage resistant p-channel MOSFET 160 is inserted to prevent a high voltage not lower than an absolute rating from being applied between the source and the drain of a low voltage resistant p-channel MOSFET as a mirrored destination of the current mirror circuit 158, and the resistors R9, R10 are set such that the gate potential expressed by R10/(R9+R10)*VDD can cause the high voltage resistant p-channel MOSFET 160 to adequately operate, as is the case with the high voltage resistant p-channel MOSFET 148. The capacitor C3 is inserted for the purpose of stabilization of a gate potential of the high voltage resistant n-channel MOSFET 162. The capacitor C4 is inserted between the node 156 as an output of the source follower and −HV, functioning as a bypass capacitor for supplying instantaneous carrying current consumed by the buffer 154 with an output drive capacity thereof, and enhanced to drive the gate of the high voltage resistant n-channel MOSFET 202.

With the current mirror circuits 146, 158, +VDD is a source side reference voltage, so that the signal path from the input logic control terminal INN of the high voltage Nch MOSFET to the high voltage resistant n-channel MOSFET 202 can be operated as a channel as a damper of −HV=0 V, and −HV is optionally variable in the range of 0 V on the order of ±200 V.

Subsequently, the transducer drive circuit 20 is described hereinafter. In FIG. 2, the transducer drive circuit 20 comprises the high voltage resistant p-channel MOSFET 200, the high voltage resistant n-channel MOSFET 202, the high voltage resistant diodes 204, 206, the resistors 208, 210, and the Zener diodes 212, 214. The respective gates of the high voltage resistant p-channel MOSFET 200 and the high voltage resistant n-channel MOSFET 202 are driven by the respective output voltage pulses at the nodes GP, GN of the MOSFET gate drive circuit 10, as described previously.

Figure 3:
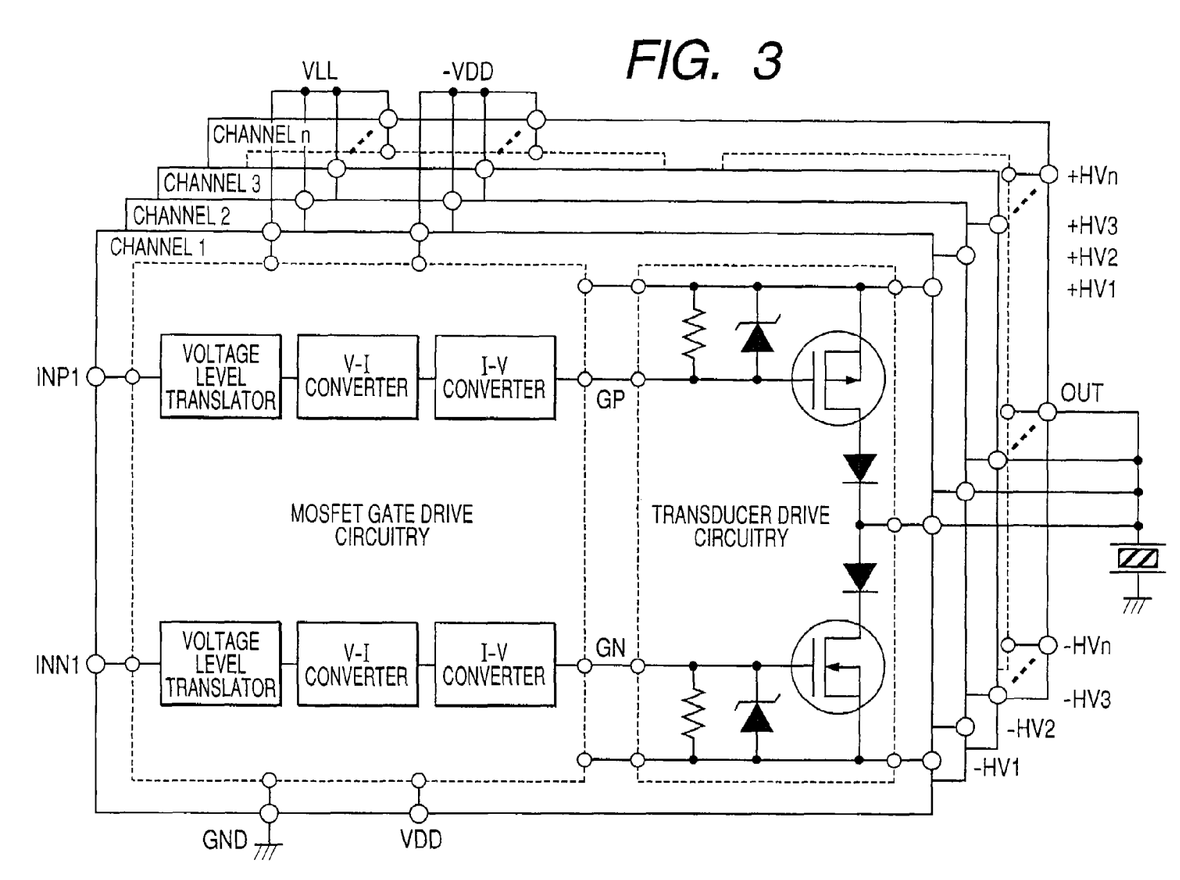
FIG. 3 is a view showing an example of a multi-channel integrated driver circuit comprising a plurality of channels, the ultrasound pulser shown in FIG. 1, serving as one unit of the channel.

As shown in FIG. 3, a multi-channel integrated driver circuit is made up by providing a plurality of (1 to n) of channels, a driver comprised of the MOSFET gate drive circuit 10, and the transducer drive circuit 20, in pairs, serving as a unit of the channel, and by integrally forming n pieces of the drivers corresponding to the plurality of the channels 1 to n, respectively, on a single semiconductor substrate. More specifically, because there is the case where the present ultrasound pulser can be implemented with the circuit shown in FIG. 1, as a unit channel, by adoption of a configuration wherein a plurality of outputs OUT of channels as drivers, and channels as dampers are short-circuited with each other, the output signal is separated between different channels by adoption of a configuration wherein respective drain outputs of the high voltage resistant p-channel MOSFET 200 and the high voltage resistant n-channel MOSFET 202 are short-circuited with each other via the high voltage resistant diodes 204, 206, respectively, to be turned into one output OUT. The resistors 208, 210, and the Zener diodes 212, 214 are inserted for the purpose of protecting the high voltage resistant p-channel MOSFET 200, and the high voltage resistant n-channel MOSFET 202, respectively, from an overvoltage being applied between the gate and the source thereof.

Thus, with the present invention, it is possible to implement a monolithic IC wherein a plurality of channels are formed on a single semiconductor substrate such as a monocrystalline silicon with the use of the driver capable of output burst operation and damper operation, in form of a pulse having positive and negative components (+HV to −HV), in the range of 0 V on the order of ±200 V, as shown in FIG. 1, serving as a unit of the channel.

The present embodiment can be carried out even by adoption of a configuration that can be driven with a voltage output pulse in either polarity, in the form of a pulse having positive and negative components (+HV to −HV) as shown in FIG. 1. More specifically, even by use of only the signal path from the input logic control terminal INP of the high voltage Pch MOSFET to the resistant p-channel MOSFET 200, or only the signal path from the input logic control terminal INN of the high voltage Nch MOSFET to the high voltage resistant n-channel MOSFET 202.

Further, if the present embodiment is carried out by use of the configuration wherein the plurality of the outputs OUT are short-circuited with each other, as shown in FIG. 3, it is possible to output a quasi-Gaussian waveform higher in quality than a burst waveform with the use a combination of the plurality of the channels adequately set to different ±HV, respectively, serving as one channel.

Further, with the present embodiment, since other types of transistors, such as a bipolar transistor and an IGBT, can be substituted for the high voltage resistant p-channel MOSFET 200, and the high voltage resistant n-channel MOSFET 202, in the transducer drive circuit 20 of FIG. 1, those MOSFETs can be used as a driver circuit for current-driving an output load besides a high voltage pulse generation circuit according the present embodiment.

As described hereinbefore, according to the present embodiment, an ultrasound pulser (a driver circuit) having an output pulse swing variable range of 0 V on the order of ±200 V, suitable for application to a medical ultrasound system, can be implemented in a form aiming at not only reduction in the number of necessary terminals per a unit channel, and relaxation of restrictions on mounting owing to elimination of needs for external capacitors by DC-coupling of the MOSFET gate drive circuit with the transducer drive circuit, but also reduction in semiconductor substrate area per the unit channel by use of low voltage resistant transistors wherever possible. In so doing, there can be obtained an advantageous effect of implementing a semiconductor integrated circuit device with a plurality of channels integrated on a small chip area.

What is claimed is:

1. A semiconductor integrated circuit comprising:
    a pair of input terminals;
    a first drive circuit connected to said pair of terminals to convert a pair of first voltage pulse signals, each said first voltage pulse signal having a first reference potential and being input using said pair of input terminals, into a pair of respective second voltage pulse signals each having a second reference potential that is higher than the first reference potential;

a second drive circuit connected to a pair of outputs of said first drive circuit and constructed to generate a fourth voltage pulse signal having a voltage swing that is based on a potential difference between the second reference potential and a ground potential to drive an external output load on the basis of the pair of second voltage pulse signals being output from the pair of outputs of said first drive circuit; and an output commonly connected to a pair of outputs of said second drive circuit that outputs the fourth voltage pulse signal from said second drive circuit to the external output load, wherein said first drive circuit is integrated with said second drive circuit monolithically into a single semiconductor substrate, wherein the pair of outputs of said first drive circuit are mutually DC-coupled with a pair of inputs of said second drive circuit, respectively, and wherein said first drive circuit includes:

a pair of voltage-to-current converters configured to convert a respective pair of said third voltage pulse signals based on the pair of first voltage pulse signals into a pair of current pulse signals, respectively; and a pair of current-to-voltage converters configured to convert the current pulse signals received from said pair of voltage-to-current converters into the pair of second voltage pulse signals, respectively, such that the first reference potential of the respective first voltage signals are changed to the second reference potential in the pair of second voltage pulse signals.

2. The semiconductor integrated circuit according to claim 1, wherein said second drive circuit has a high voltage resistance that is higher than that of said first drive circuit.

3. The semiconductor integrated circuit according to claim 2, wherein said first drive circuit further comprises a pair of voltage level translators that interconnect said pair of input terminals with respective inputs of said pair of voltage-to-current converters, respectively, and wherein the pair of first voltage pulse signals each having the first reference potential and a first voltage swing are converted into the pair of third voltage pulse signals each having the second reference potential and a second voltage swing, using the respective voltage level translators.

4. The semiconductor integrated circuit according to claim 3, further comprising:

a pair of first power supply voltage terminals for receiving a first power supply voltage;

a pair of second power supply voltage terminals for receiving a second power supply voltage that is higher than the first power supply voltage; and a pair of third power supply voltage terminals for receiving a third power supply voltage, wherein each of said pair of voltage level translators of said first drive circuit is connected to both of said pair of first and third power supply voltage terminals, wherein said pair of voltage-to-current converters of said first drive circuit are connected to said pair of third power supply voltage terminals, respectively, wherein said current-to-voltage converters of said first drive circuit are connected to said pairs of second and third power supply voltage terminals, respectively, and wherein said second drive circuit is connected to said pair of second power supply voltage terminals, said second drive circuit generating the fourth voltage pulse signal from the second power supply voltage applied to said second drive circuit via said pair of second power supply voltage terminals on the basis of the second voltage pulse signal.

5. The semiconductor integrated circuit according to claim 4, wherein an input gate voltage swing of said second drive circuit is generated by an internal power supply circuit that includes a source follower in the respective current-to-voltage converter of said first drive circuit, on the basis of the second power supply voltage.

6. The semiconductor integrated circuit according to claim 1, wherein the external output load is an ultrasonic transducer, said second drive circuit is a transducer drive circuit for driving the ultrasonic transducer, and said first drive circuit is a MOSFET gate drive circuit for driving high voltage MOSFET gates, and wherein said MOSFET gate drive circuit and the transducer drive circuit together form an ultrasound pulser for a medical ultrasound system.

7. The semiconductor integrated circuit according to claim 6, wherein the semiconductor integrated circuit provides a plurality of channels, wherein the ultrasound pulser comprised of the MOSFET gate drive circuit and the transducer drive circuit serves as one channel unit, and wherein a plurality of the ultrasound pulsers corresponding to the plurality of the channels are integrally formed on a single semiconductor substrate.

8. A semiconductor integrated circuit comprising:

a first drive circuit having a first high voltage resistance; and a second drive circuit connected to a back stage of the first drive circuit and having a second high voltage resistance that is higher than the first high voltage resistance, wherein the first drive circuit includes voltage-to-current converters that convert respective input voltage signals each having a first reference potential into a pair of current signals, respectively, and current-to-voltage converters that convert the current signals into a pair of voltage signals each having a second reference potential that is higher than the first reference potential, wherein the pair of voltage signals each have a voltage pulse swing that is based on an output voltage determined to maintain a fixed difference with respect to a voltage that is necessary to drive the second drive circuit, wherein the first drive circuit further includes a plurality of voltage level translators each connected to respective inputs of the voltage-to-current converters, each said voltage level translator being configured to convert one of said first voltage pulse signals as received having a first reference potential, into a corresponding second voltage pulse signal having a second reference potential that is higher than the first reference potential, and wherein the first voltage pulse signals having the first reference potential and a first voltage swing are each converted into a third voltage pulse signal and a second voltage swing by the respective voltage level translator, and each said third voltage pulse signal is converted into a second voltage pulse signal using a respective voltage-to-current converter and a respective current-to-voltage converter.

9. The semiconductor integrated circuit according to claim 8, further comprising:
- a pair of first power supply voltage terminals for receiving a first power supply voltage;
- a pair of second power supply voltage terminals for receiving a second power supply voltage that is higher than the first power supply voltage; and
- a pair of third power supply voltage terminals for receiving a third power supply voltage,
- wherein the first drive circuit is connected to the first, second, and third pairs of power supply voltage terminals, respectively, and the second drive circuit is connected to the pair of second power supply voltage terminals, and
- wherein the second drive circuit generates a fourth voltage pulse signal from the second power supply voltage applied to the second drive circuit on the basis of the second voltage pulse signal.

10. The semiconductor integrated circuit according to claim 9,
- wherein an input gate voltage swing of the second drive circuit is generated by an internal power supply circuit that includes a source follower on the basis of the second power supply voltage applied to the second drive circuit.

11. A semiconductor integrated circuit comprising:
- a first drive circuit having a first high voltage resistance; and
- a second drive circuit connected to a back stage of the first drive circuit and having a second high voltage resistance that is higher than the first high voltage resistance,
- wherein the first drive circuit is operated using first, second, and third operating voltages and includes a circuit that generates a second potential having a predetermined potential difference with respect to a predetermined third potential,
- wherein the second drive circuit is operated at the second potential as an operating voltage,
- wherein signal transmission from the first drive circuit to the second drive circuit is provided by a plurality of voltage-to-current converters that each convert an input voltage signal into a current signal, and a plurality of respective current-to-voltage converters that each convert the current signal into a voltage signal,
- wherein the first drive circuit further comprises a plurality of voltage level translators each connected to a respective input of one of the voltage-to-current converters, each said voltage level translator being configured to convert one of said first voltage pulse signals as received having a first reference potential, into a corresponding second voltage pulse signal that has a second reference potential that is higher than the first reference potential, and to convert a first voltage swing into a third voltage pulse signal and a second voltage swing by the respective voltage level translator, and each said third voltage pulse signal is converted into a second voltage pulse signal using a respective voltage-to-current converter and a respective current-to-voltage converter.

12. The semiconductor integrated circuit according to claim 11, further comprising:
- a pair of first power supply voltage terminals for receiving a first power supply voltage;
- a pair of second power supply voltage terminals for receiving a second power supply voltage that is higher than the first power supply voltage; and
- a pair of third power supply voltage terminals for receiving a third power supply voltage,
- wherein the first drive circuit is connected to the first, second, and third pairs of power supply voltage terminals, respectively, and the second drive circuit is connected to the second pair of power supply voltage terminals, and
- wherein the second drive circuit generates a fourth voltage pulse signal from the second power supply voltage applied to the second drive circuit on the basis of the second voltage pulse signal.

13. The semiconductor integrated circuit according to claim 12,
- wherein an input gate voltage swing of the second drive circuit is generated by an internal power supply circuit that includes a source follower on the basis of the second power supply voltage applied to the second drive circuit.

* * * * *